United States Patent [19]

Crowder et al.

[11] 4,098,618
[45] Jul. 4, 1978

[54] METHOD OF MANUFACTURING SEMICONDUCTOR DEVICES IN WHICH OXIDE REGIONS ARE FORMED BY AN OXIDATION MASK DISPOSED DIRECTLY ON A SUBSTRATE DAMAGED BY ION IMPLANTATION

[75] Inventors: Billy Lee Crowder, Putnam Valley; William Ralph Hunter; Douglas William Ormond, Jr., both of Ossining, all of N.Y.

[73] Assignee: International Business Machines Corporation, Armonk, N.Y.

[21] Appl. No.: 803,182

[22] Filed: Jun. 3, 1977

[51] Int. Cl.² .................... H01L 21/265; H01L 21/76
[52] U.S. Cl. ........................................ 148/1.5; 357/91
[58] Field of Search .................... 357/50, 91; 148/1.5

[56] References Cited

U.S. PATENT DOCUMENTS

| | | | |
|---|---|---|---|
| 3,900,345 | 8/1975 | Lesk | 148/1.5 |
| 3,900,350 | 8/1975 | Appels et al. | 148/175 |
| 3,961,999 | 6/1976 | Antipov | 148/175 |
| 3,966,501 | 6/1976 | Nomura et al. | 148/1.5 |

OTHER PUBLICATIONS

Makris et al., "Forming Fine-line Geometries in Integrated Circuits," IBM-TDB, 16, (1974), 3240.
KO et al., "An Ion-Implantation Process for Making Bipolar Devices," IBM-TDB, 19, (1976), 1704.

*Primary Examiner*—L. Dewayne Rutledge
*Assistant Examiner*—Upendra Roy
*Attorney, Agent, or Firm*—John J. Goodwin

[57] ABSTRACT

A method of manufacturing semiconductor devices of the type wherein regions of oxide such as silicon oxide recessed or inset in a silicon substrate are formed by oxidation of the silicon with the use of a masking layer protecting locally against the oxidation. In order to prevent the formation of a projecting oxide beak under the masking layer a nitride oxidation mask is applied directly to the substrate which has been previously ion-implanted to a controlled depth and then annealed to generate a dense dislocation network array on the substrate surface to prevent mechanical stress defects which normally would occur when a nitride mask is applied directly to a substrate.

6 Claims, 7 Drawing Figures

METHOD OF MANUFACTURING SEMICONDUCTOR DEVICES IN WHICH OXIDE REGIONS ARE FORMED BY AN OXIDATION MASK DISPOSED DIRECTLY ON A SUBSTRATE DAMAGED BY ION IMPLANTATION

BACKGROUND OF THE INVENTION

1. Field of the Invention

The present invention relates to the fabrication of semiconductor devices with recessed oxide regions and more particularly to a method for applying a nitride mask directly on a substrate previously damaged by ion implantation and then annealed.

2. Description of the Prior Art

It is well known in the fabrication of semiconductors having recessed oxide regions which are delineated by masks composed for example of silicon nitride, that on growing the thick oxide region a thin protruding oxide also grows underneath the silicon nitride oxidation mask. This thin protrusion in what will be the gate region is termed "bird's beak" due to its beak-like cross-sectional profile and its presence is ascribed to lateral diffusion of oxygen underneath the thin silicon dioxide pad which is disposed between and separates the silicon nitride mask from the surface of the silicon substrate. The thin silicon dioxide pad is used because disposing the silicon nitride mask directly on the silicon substrate produces stress induced defects and dislocations in the silicon substrate which deleteriously affect device performance. Thus, the use of the silicon dioxide pad to prevent stress defects results in the undesired bird's beak condition.

Heretofore, attempts have been made to improve the fabrication process by continuing to use a separation pad and to minimize the resultant bird's beak condition.

For example, U.S. Pat. No. 3,900,350 issued Aug. 18, 1975 to Appels et al. and assigned to U.S. Philips Corporation teaches an approach to reducing the bird's beak condition by using a polycrystalline silicon pad under the oxidation mask instead of the usual silicon oxide. This patent also provides a substantial teaching of the stress defects that will occur when the silicon nitride oxidation mask is disposed directly on the silicon substrate.

U.S. Pat. No. 3,961,999 issued June 8, 1976 to Antipov and assigned to IBM Corporation also describes a method for minimizing the bird's beak problem. In this patent the usual silicon dioxide pad is located between the silicon substrate and the silicon nitride layer. The technique taught in this patent involves etching holes through the silicon dioxide pad, the holes correspond to the openings in the nitride mask to enable the undercutting and exposure of the underside of the silicon nitride layer at the periphery of the silicon dioxide layer openings.

The two aforementioned patents are typical of the prior art in that the approaches continue to employ a pad between the nitride mask and the silicon substrate and then attempt to minimize the resultant bird's beak problem that is caused thereby.

The method of the present invention is unique in that it eliminates the need for on the intermediate pad between the mask and the substrate which gave rise to the bird's beak problem in the first place. The method of the present invention permits the nitride mask to be disposed directly on the silicon substrate and eliminates the stress defects which have heretofore been caused by this arrangement. The method of its present invention includes the steps of initially damaging the surface of the silicon substrare by ion implantation to a controlled depth and then annealing to generate a dense dislocation network array which prevents the stress induced defect propagation from the masking layer.

It is known that ion implantation of silicon as employed in the present invention can be used to harden silicon. The publication of S. M. Hu in the IBM Technical Disclosure Bulletin, Vol. 19, No. 2, July 1976 entitled "Hardening Silicon Wafers by Ion Implantation" uses such techniques to reduce dislocations in thermally stressed silicon wafers.

SUMMARY OF THE INVENTION

An object of the present invention is to provide an improved method for fabricating semiconductor devices wherein the problem of the formation of a projecting oxide beak under an oxidation masking layer is eliminated.

Another object of the present invention is to provide an improved method for fabricating semiconductor devices wherein an oxidation masking layer is disposed directly on a silicon substrate without resultant stress induced defects.

A futher object of the present invention is to provide an improved method for fabricating semiconductor devices wherein a silicon substrate is ion implanted and annealed to produce a dense dislocation network array on the surface thereof to allow an oxidation mask to be disposed on the substrate surface without resultant stress induced defects being produced.

DETAILED DESCRIPTION OF THE PREFERRED EMBODIMENTS

Figure 1A:
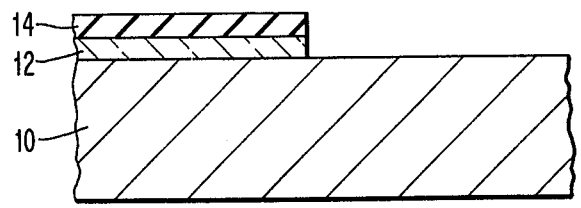
FIGS. 1A, 1B and 1C illustrate various stages in the formation of a recessed oxide region in a silicon substrate employing a nitride oxidation mask and a silicon dioxide pad as known in the prior art.
Figure 1B:
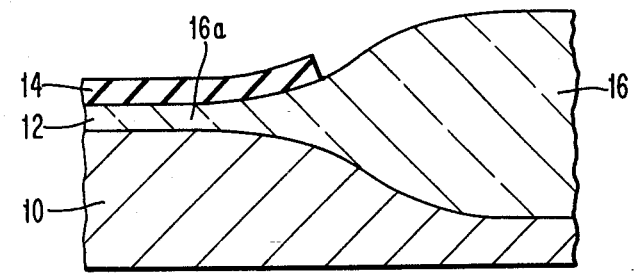
Figure 1C:
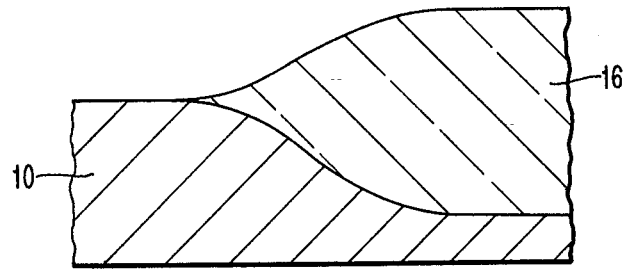

FIGS. 1A, 1B and 1C illustrate a cross-section of a silicon substrate, a silicon dioxide pad and a silicon nitride mask combination and the manner in which a bird's beak occurs. In FIG. 1A the silicon substrate 10 is shown having a silicon nitride 14 mask over the desired region. The silicon nitride mask 14 is separated from substrate 10 by a silicon dioxide pad 12 because the combination of the nitride mask 14 directly on substrate 10 will produce stress deformations in the silicon substrate which will cause poor device performance.

In FIG. 1B the recessed oxide 16 is grown in the ion mask region and a projecting oxide spur 16a occurs under the mask 14. After oxidation the mask 14 is removed as shown in FIG. 1C. Due to the comparatively wide spur of silicon oxide 16a along the recessed oxide pattern, a part of the beak-like spur of silicon oxide 16a remains upon removing the nitride mask 14 and the underlying thin oxide layer 12 by the etching process. Such remaining part of the spur on bird's beak produces an undesired masking effect upon subsequent semiconductor diffusion processes, and may possibly even determine the lateral boundary of the diffused zone, in which case the semiconductor p-n junction of the zone with the remaining region of the originally present material may have curved edges. In later semiconductor steps in forming the diffused zone it is even possible that the p-n junction could become exposed.

As previously stated with reference to U.S. Pat. No. 3,900,350, a pad composed of polycrystalline silicon instead of silicon dioxide may be used. The polycrystalline silicon pad on the monocrystalline silicon substrate reduces the stresses caused by the nitride mask and at the same time minimizes the bird's beak. This technique still employs the use of a relatively thick intermediate pad which must be removed by etching or conversion to oxide followed by etching.

Figure 2A:
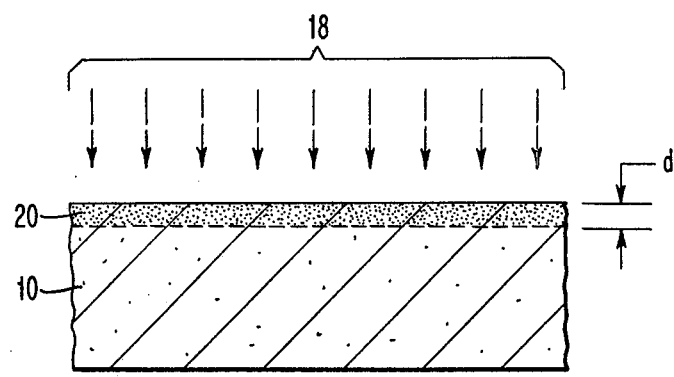
FIGS. 2A, 2B, 2C and 2D illustrate various stages in the formation of a recessed oxide region in a silicon substrate employing a nitride oxidation mask directly on the substrate after the substrate has been ion implanted and annealed according to the principles of the present invention.
Figure 2B:
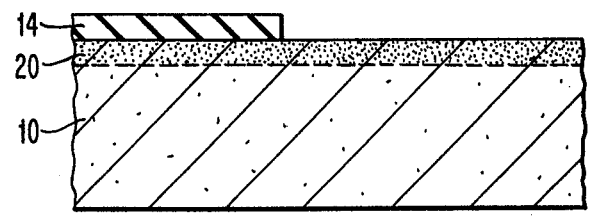

Referring to FIG. 2A, a cross-section of a silicon substrate 10 is shown which is ion implanted by beam 18 to a controlled depth $d$. The ion implantation produces a heavily damaged and even amorphous layer 20 on the surface 10. Substrate 10 is then annealed and the heavily damaged layer 20 generates a very dense dislocation network array, the microstructure of which depends on the ion energy, ion dose and ion species employed in the implantation The dense dislocation network array produced by the implantation and annealing protects the underlying single crystal silicon from stress induced defects, and permits a nitride oxidation mask 14 to be disposed directly on substrate 10 as illustrated in FIG. 2B.

Figure 2C:
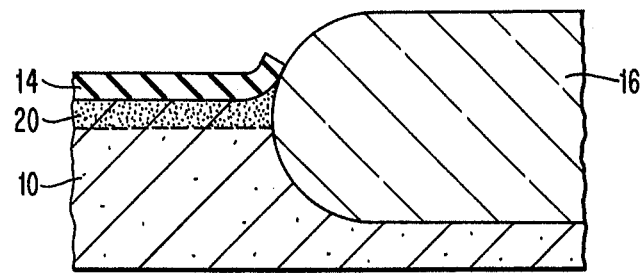
Figure 2D:
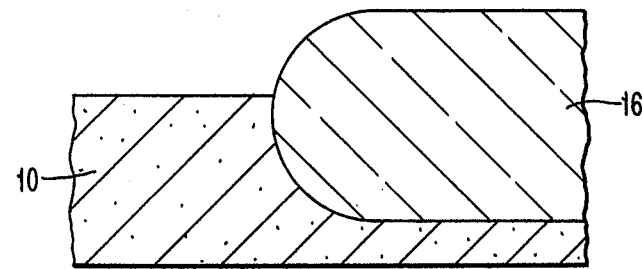

The implanted and annealed surface of substrate 10 is also protected against oxidation so that bird's beaking, which results from the lateral spur of silicon oxide which is formed by oxidation of the silicon present below the mask by lateral diffusion of oxide via the prior art thin silicon oxide pad, is not formed. Thus, FIG. 2C illustrates the cross-sections of the structure after oxidation, and FIG. 2D illustrates the structure after the removal of the nitride oxidation mask and, if necessary, the dense dislocation network 20 wherein the bird's beak is not present.

A specific example of the fabrication of a particular embodiment is provided as follows: Step (1) Implantation of Ar into the bare-silicon substrate 10 with an implantation energy of 20KeV at a total dose of approximately $10^{15} cm^{-2}$ to form layer 20 which then may be annealed by conventional techniques; Step (2) Low temperature deposition of $Si_3N_4$ to a thickness in the range of 300 to 1000 Angstroms to form layer 14; Step (3) Patterning of the $Si_3N_4$ oxidation mask by conventional (i.e. photolithographic) procedures; Step (4) Isolation oxidation, for example, 6500 Angstroms dry-wet-dry; Step (5) Removal of the $Si_3N_4$ oxidation mask by conventional process such as buffered HF + hot $H_3PO_4$; Step (6) Removal of the damaged Si layer, if necessary, by either etching of the Si (about 500 Angstroms) or by oxidation of the damaged region (growth of about 1000 Angstroms $SiO_2$) followed by etching off the oxide.

It is possible to perform Step (1) after Step (2) provided that the ion energy is increased sufficiently to carry out implantation through the nitride layer. The choice of the ion species is determined mainly by the fact that it should, in nearly all cases, not be electrically active in silicon. For example, Si, Ge, Ar, Ne and O are possible candidates.

The ion energy controls the depth of the damaged region. The ion dose should be close to the critical dose for the formation of a continuous amorphous layer in silicon, for example, $5 \times 10^{14}$ to $10 \times 10^{14}$ ions per $cm^{-2}$ for Ar in Si. Also, Step (6) may not be required in fabricating bipolar devices but is necessary in MOSFET construction.

What has been described is an improved method for fabricating semiconductor devices wherein the condition known as "bird beaking" is eliminated by treating the semiconductor substrate by ion implantation in order to generate a dislocation network, a nitride mask may be directly applied to the resultant surface of the semiconductor substrate without the need of an intermediate silicon dioxide pad.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a semiconductor device comprising the steps of:
   providing a semiconductor substrate,
   ion implanting a surface of said semiconductor substrate to damage said surface to produce a dense dislocation network array layer,
   providing a nitride oxidation mask layer directly on said damaged substrate surface,
   patterning said nitride mask layer to form openings at the areas where it is desired to inset oxide,
   oxidizing said semiconductor substrate until an inset oxide is formed in the areas of said openings,
   and removing said nitride oxidation mask.

2. A method according to claim 1 wherein nitride oxidation mask layer is first applied to said semiconductor substrate and said ion implantation of said substrate is performed through said nitride oxidation mask.

3. A method according to claim 1 further including a final step of removing said damaged silicon layer by etching.

4. A method according to claim 1 wherein said semiconductor substrate is monocrystalline silicon.

5. A method according to claim 4 wherein said implanted ion species is not electrically active in said silicon substrate and is selected from the group including argon, germanium, neon, oxygen and silicon.

6. A method according to claim 5 wherein ion implantation energy controls the depth of said damaged layer and is approximately equal to the critical dose for the formation of a continuous amorphous layer in silicon, said critical dose being in the order of $5 \times 10^{14}$ to $10 \times 10^{14}$ for argon in said silicon substrate.

* * * * *